United States Patent
Raskin et al.

(10) Patent No.: US 11,222,944 B2
(45) Date of Patent: Jan. 11, 2022

(54) INTEGRATED CIRCUIT DEVICE AND METHOD OF MANUFACTURING THEREOF

(71) Applicant: UNIVERSITE CATHOLIQUE DE LOUVAIN, Louvain-la-Neuve (BE)

(72) Inventors: Jean-Pierre Raskin, Louvain-la-Neuve (BE); Martin Rack, Louvain-la-Neuve (BE)

(73) Assignee: UNIVERSITE CATHOLIQUE DE LOUVAIN, Louvain-la-Neuve (BE)

(*) Notice: Subject to any disclaimer, the term of this patent is extended or adjusted under 35 U.S.C. 154(b) by 0 days.

(21) Appl. No.: 17/051,916

(22) PCT Filed: May 2, 2019

(86) PCT No.: PCT/EP2019/061318
§ 371 (c)(1),
(2) Date: Oct. 30, 2020

(87) PCT Pub. No.: WO2019/211412
PCT Pub. Date: Nov. 7, 2019

(65) Prior Publication Data
US 2021/0118977 A1    Apr. 22, 2021

(30) Foreign Application Priority Data
May 2, 2018 (EP) .................................... 18170439

(51) Int. Cl.
*H01L 21/84* (2006.01)
*H01L 27/12* (2006.01)
(Continued)

(52) U.S. Cl.
CPC .............. *H01L 28/10* (2013.01); *H01L 21/84* (2013.01); *H01L 27/1203* (2013.01); *H01L 21/76254* (2013.01)

(58) Field of Classification Search
CPC ..... H01L 27/1203; H01L 21/84; H01L 23/66; H01L 27/13; H01L 23/645
(Continued)

(56) References Cited

U.S. PATENT DOCUMENTS

2015/0228714 A1    8/2015  Gorbachov et al.
2017/0372946 A1*  12/2017  Peidous et al. ... H01L 21/76254

OTHER PUBLICATIONS

"New Substrate-Crosstalk Reduction Structure Using SOI Substrate," 2001 IEEE International SOI Conference Proceedings, Durango, Colorado, Oct. 1-4, 2001, pp. 107-108.
(Continued)

*Primary Examiner* — Thinh T Nguyen
(74) *Attorney, Agent, or Firm* — Karceski IP Law, PLLC

(57) ABSTRACT

An integrated circuit device includes a semiconductor substrate having a resistivity of at least 100 Ω·cm. An electrically insulating layer contacts the semiconductor substrate. The electrically insulating layer is susceptible of inducing in the semiconductor substrate a parasitic surface conduction layer that interfaces with the electrically insulating layer. An electrical circuit is located on the electrically insulating layer. The electrical circuit includes a section capable of inducing an electrical field in the semiconductor substrate. The integrated circuit device includes a depletion-inducing junction of which at least a portion is comprised in the semiconductor substrate. The depletion-inducing junction can autonomously induce in the semiconductor substrate a depleted zone that interfaces with a section of the electrically insulating layer that lies in-between two sections of the electrical circuit.

10 Claims, 7 Drawing Sheets

(51) Int. Cl.
 *H01L 49/02* (2006.01)
 *H01L 21/762* (2006.01)
(58) Field of Classification Search
 USPC .......................... 257/347, 348; 438/149, 479
 See application file for complete search history.

(56) References Cited

OTHER PUBLICATIONS

"Fabrication and Characterization of High Resistivity SOI Wafers for RF Applications" by Lederer et al. published in ECS Trans. 2008, vol. 16, Issue 8, pp. 165-174.
International Preliminary Report on Patentability dated Aug. 3, 2020, for International Patent Application No. PCT/EP2019/061318.
International Search Report dated Sep. 12, 2019, for International Patent Application No. PCT/EP2019/061318.

\* cited by examiner

INTEGRATED CIRCUIT DEVICE AND METHOD OF MANUFACTURING THEREOF

CROSS-REFERENCE TO RELATED APPLICATION(S)

This is a National Stage Entry into the United States Patent and Trademark Office from International Patent Application No. PCT/EP2019/061318, filed on May 2, 2019, which claims priority to European Patent Application No. 18170439.6 filed on May 2, 2018, the entire contents of both of which are incorporated herein by reference.

FIELD OF THE INVENTION

An aspect of the invention relates to an integrated circuit device that comprises a semiconductor substrate and an electrically insulating layer that contacts the semiconductor substrate. The integrated circuit device may comprise an electrical circuit that is adapted to operate at a relatively high frequency, for example, a frequency higher than 100 MHz. Another aspect of the invention relates to a method of manufacturing an integrated circuit device.

BACKGROUND OF THE INVENTION

The article entitled "Fabrication and Characterization of High Resistivity SOI Wafers for RF Applications" by Lederer et al. published in ECS Trans., 2008, Volume 16, Issue 8, Pages 165-174, provides an overview of the issues associated with parasitic surface conduction in oxidized high resistivity silicon wafers, such as high resistivity silicon on insulator. In such wafers parasitic surface conduction is related to the presence of free carriers at the substrate surface. Most of these issues are suppressed when the substrate surface is passivated with a trap-rich layer of material, such as polysilicon.

A technique to fabricate substrate-passivated high resistivity silicon on insulator wafers consists of depositing a 300 nm layer of silicon on a high resistivity silicon substrate by Low-Pressure Chemical Vapor Deposition (LPCVD) at 525° C. At such a low temperature, silicon is deposited in its amorphous form and is therefore thermodynamically unstable. Recrystallization of the top silicon layer into polysilicon is then obtained by performing rapid thermal annealing at 950° C. during 15 s. The passivated high resistivity silicon on insulator substrate is then obtained by using a conventional bonding operation and so-called Smart-Cut process, except that in this case the bonding is performed between the oxidized donor wafer and the passivated high resistivity substrate.

Patent publication US20150228714A1 describes a radio frequency integrated circuit with a silicon-on-insulator substrate includes a buried oxide layer that is disposed over a silicon substrate. The silicon-on-insulator substrate has a silicon layer that is disposed over the buried oxide layer. The integrated circuit includes a transistor disposed on the silicon layer, and a guard-ring in the silicon-on-insulator substrate that surrounds the transistor on the silicon layer. Depletion regions on the silicon substrate corresponding to areas surrounding the transistor are defined by the application of a voltage to the guard-ring. Isolation of radio frequency transmission lines on silicon-on-insulator substrates is also possible with this configuration.

SUMMARY OF THE INVENTION

There is a need for a solution for countering parasitic surface conduction that better meets at least one of the following criteria: moderate cost, ease of integrated circuit manufacturing, and compatibility with diverse integrated circuit manufacturing techniques.

In accordance with an aspect of the invention, an integrated circuit device is provided, which comprises:

a semiconductor substrate having a resistivity of at least 100 Ω·cm;

an electrically insulating layer that contacts the semiconductor substrate, the electrically insulating layer being susceptible of inducing in the semiconductor substrate a parasitic surface conduction layer that interfaces with the electrically insulating layer; and an electrical circuit located on the electrically insulating layer, wherein the integrated circuit device comprises a depletion-inducing junction of which at least a portion is comprised in the semiconductor substrate, the depletion-inducing junction being adapted to autonomously induce in the semiconductor substrate a depleted zone that interfaces with a section of the electrically insulating layer that lies in-between two sections of the electrical circuit.

The depletion-inducing junction as defined hereinbefore may be implemented at less cost than the technique described in the aforementioned article, which consists in fabricating substrate-passivated high resistivity silicon on insulator. The depletion-inducing junction as defined hereinbefore may be implemented at less cost than the technique described in the aforementioned patent publication, which requires specific design of a guard ring and manufacture of the guard ring. Thus, an integrated circuit device as defined hereinbefore also allows greater versatility in design and manufacture.

What is more, the depletion-inducing junction can be compatible with technology that makes use of a buried oxide layer to define a back-gate terminal for a transistor to improve channel control and transistor performance. In contrast, in the technique described in the aforementioned article, the definition of a back gate can be quite difficult.

Another advantage is that the depletion-inducing junction can be resistant to thermal variations in an integrated circuit manufacturing process. In contrast, in the technique described in the aforementioned article, there is a risk of partial recrystallization of a polysilicon trap-rich layer. This may reduce the number of traps, thereby degrading electrical performance of the semiconductor substrate.

In accordance with a further aspect of the invention, a semiconductor wafer is provided. This semiconductor wafer is adapted for manufacturing an integrated circuit device as specified hereinbefore.

In accordance with yet further aspects of the invention, a method of manufacturing an integrated circuit device as specified hereinbefore is provided.

For the purpose of illustration, some embodiments of the invention are described in detail with reference to accompanying drawings. In this description, additional features will be presented and advantages thereof will become apparent.

DESCRIPTION OF EMBODIMENT(S) OF THE INVENTION

Figure 1:
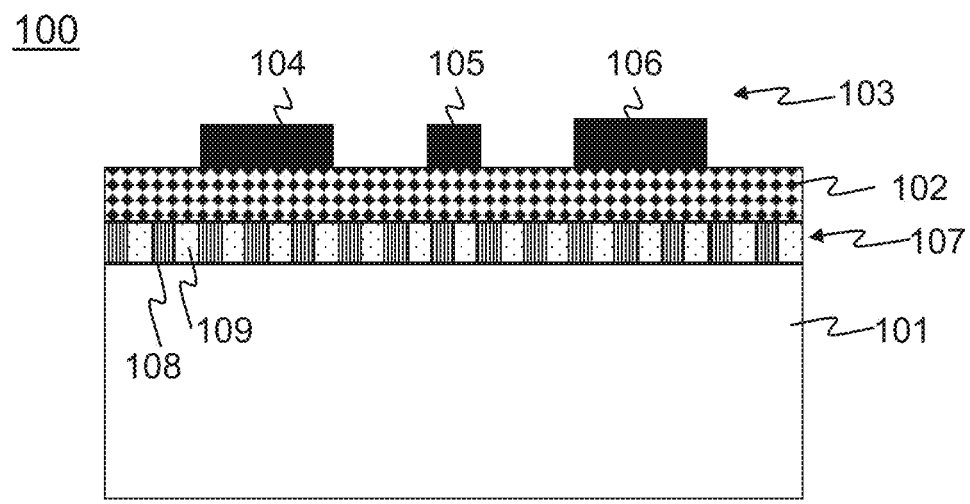
FIG. 1 is a schematic cross-sectional view of a first embodiment of an integrated circuit device comprising a plurality of depletion-inducing junctions.
Figure 2:
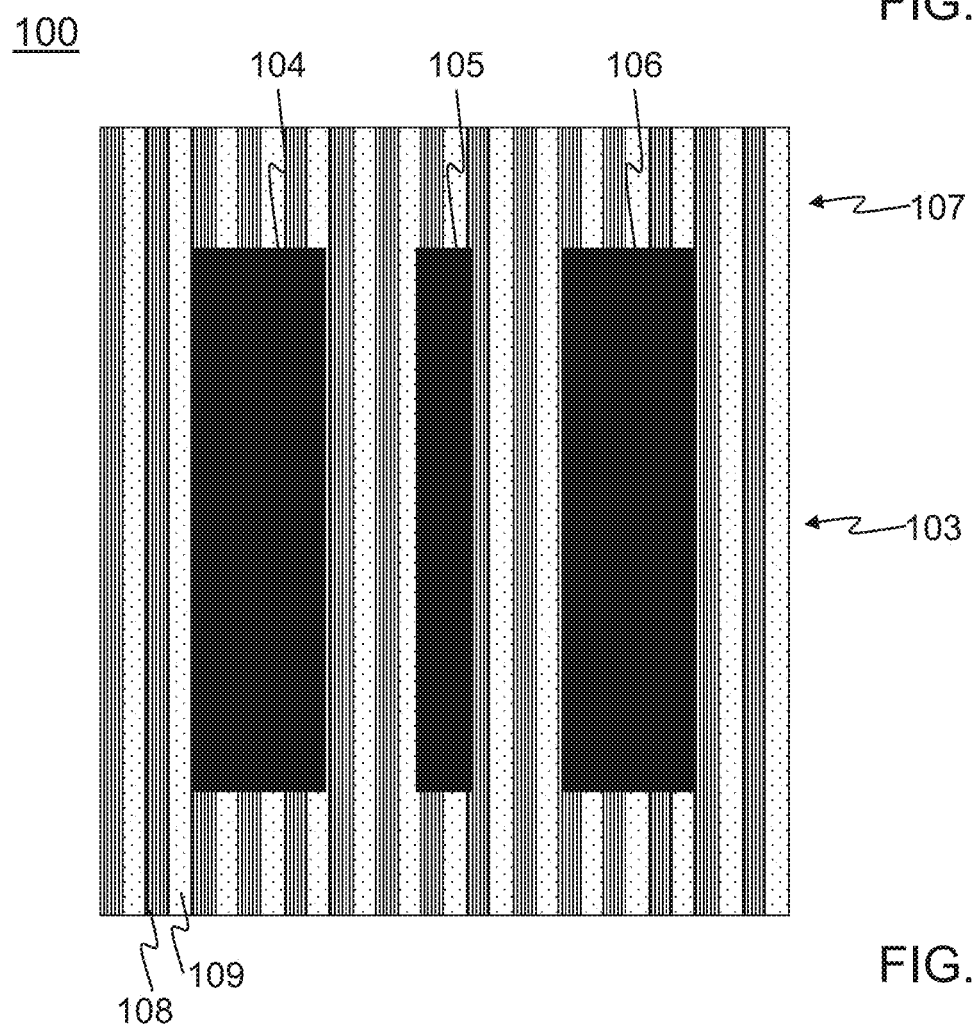
FIG. 2 is a schematic semi-transparent top view of the first embodiment of the integrated circuit device comprising the plurality of depletion-inducing junctions.

FIGS. 1 and 2 schematically illustrate an integrated circuit device 100. FIG. 1 provides a schematic cross-sectional view of integrated circuit device 100. FIG. 2 provides a semi-transparent top view of the integrated circuit device 100.

The integrated circuit device comprises a semiconductor substrate 101, an electrically insulating layer 102 that contacts the semiconductor substrate, and an electrical circuit 103 located on the electrically insulating layer 102. The semiconductor substrate 101 may comprise, for example, silicon, germanium, gallium arsenide, or any other type of material or composition in which electrical circuits may be formed. In the sequel, it is assumed that the semiconductor substrate 101 essentially comprises silicon. The electrically insulating layer 102 may essentially comprise, for example, silicon oxide.

The semiconductor substrate 101 has a relatively high resistivity. For example, the semiconductor substrate 101 may have a resistivity of at least 100 Ω·cm. As another example, the semiconductor substrate 101 may have a resistivity of at least 1 k Ω·cm. The electrically insulating layer 102 is susceptible of inducing in the semiconductor substrate 101 a parasitic surface conduction layer that interfaces with the electrically insulating layer 102. This is discussed in the article entitled "Fabrication and Characterization of High Resistivity SOI Wafers for RF Applications" identified hereinbefore.

In this embodiment, the electrical circuit 103 comprises a coplanar waveguide that has three electrically conductive strips 104, 105, 106. One conductive strip 105 may constitute a signal line; the other two conductive strips 104, 106 may constitute signal ground. The conductive strip 105 that constitutes the signal line is capable of inducing an electrical field in the semiconductor substrate 101 when a signal is present on the signal line. In case the parasitic surface conduction layer mentioned hereinbefore is present in the semiconductor substrate 101, this constitutes a parasitic electrically conductive path through which a portion of the signal may reach the two conductive strips 104, 106 that constitute signal ground. This may potentially affect performance of the coplanar waveguide.

The integrated circuit device 100 comprises a plurality of pairs of doped regions 107 in the semiconductor substrate 101 near the electrically insulating layer 102. In a pair of doped regions 108, 109, the one and the other doped region interface with each other and have opposite polarities. That is, the one doped region 108 may be of the P-type, the other doped region 109 and may be of the N-type.

The plurality of pairs of doped regions 107 constitutes a plurality of depletion-inducing junctions. More specifically, a pair of doped regions 108, 109 constitutes a depletion-inducing junction that induces a depleted zone extending from the electrically insulating layer 102 into the semiconductor substrate 101. At least one depleted zone is located between the conductive strip 105 that constitutes the signal line and each of the two conductive strips 104, 106 that constitute signal ground. That is, the depletion-inducing junction autonomously induces in the semiconductor substrate 101 a depleted zone that interfaces with a section of the electrically insulating layer 102 that lies in-between two sections of the electrical circuit 103. The term "autonomously" refers to the fact that the depletion-inducing junction need not receive a biasing voltage in order to induce the depleted zone in the semiconductor substrate 101.

Figure 3:
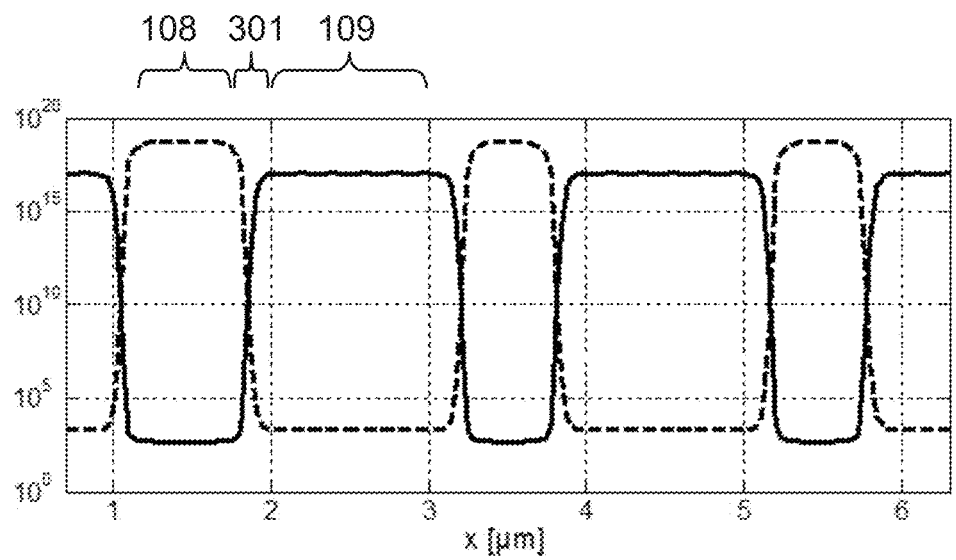
FIG. 3 is a graph in which carriers concentrations in an upper substrate layer in the first embodiment of the integrated circuit device are plotted as a function of horizontal location in the upper substrate layer.

FIG. 3 is a graph illustrating carrier concentrations in an upper layer of the semiconductor substrate 101 in which the plurality of pairs of doped regions 107 is present. The graph comprises a horizontal axis that represents a horizontal location in the upper layer. The graph comprises a vertical axis that represents free charge carrier concentrations, which is expressed as number of carriers per cubic centimeter. The graph comprises two curves. A curve in full lines represents carriers of the N-type, that is, electrons, whereas a curve in broken lines represents carriers of the P-type, that is, holes. The graph of FIG. 3 shows a depleted zone 301 between the P-doped region 108 and the N-doped region 109.

Figure 4:
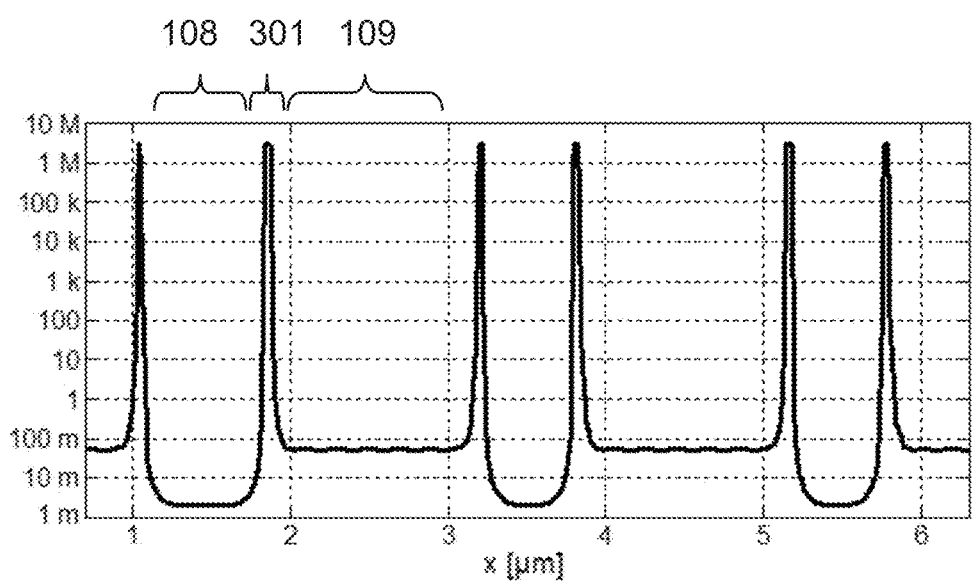
FIG. 4 is a graph in which resistivity in the upper substrate layer in the first embodiment of the integrated circuit device is plotted as a function of horizontal location in the upper substrate layer.

FIG. 4 is a graph illustrating resistivity in an upper layer of the semiconductor substrate 101 in which the plurality of pairs of doped regions 107 is present. The graph comprises a horizontal axis similar to that of FIG. 3, representing a horizontal location in the upper layer. The graph comprises a vertical axis that represents resistivity, which is expressed as Ω·cm.

The graph of FIG. 4 shows that the resistivity is relatively high in the depleted zone 301. The depleted zone 301 that extends from the electrically insulating layer 102 into the semiconductor substrate 101 thus counters parasitic surface conduction. Also deferring to FIG. 1, the depleted zone 301 in the semiconductor substrate 101 interfaces with a section of the electrically insulating layer 102 that may lie in-between two sections of the electrical circuit 103.

Figure 5:
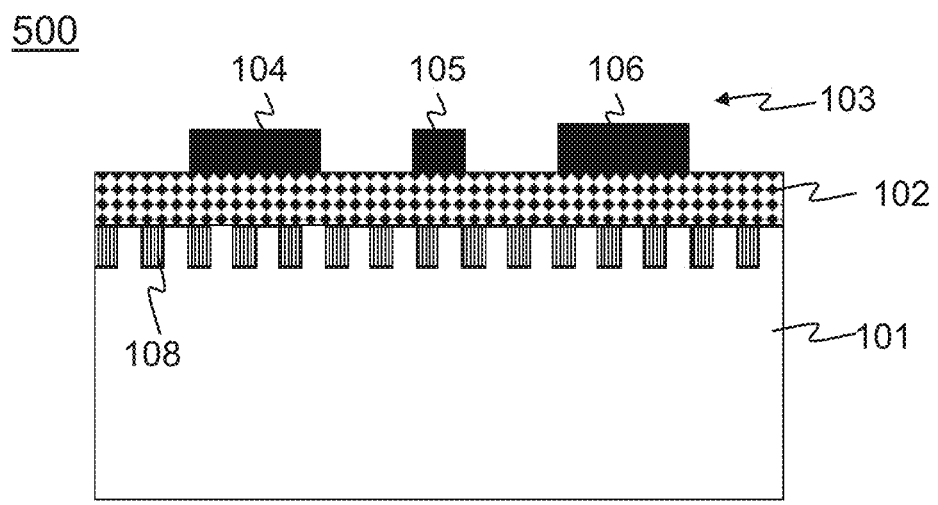
FIG. 5 is a schematic cross-sectional view of a second embodiment of an integrated circuit device comprising a plurality of depletion-inducing junctions.

FIG. 5 schematically illustrates an integrated circuit device 500, which is an alternative to the integrated circuit device 100 illustrated in FIG. 1. FIG. 5 provides a schematic cross-sectional view of the integrated circuit device 500. This embodiment may be obtained on the basis of that illustrated in FIGS. 1 and 2 by omitting one doped region 109 in each of the pairs of the regions 108, 109. The doped region 109 that remains has a polarity that is opposite to a polarity of free charge carriers in an adjacent region where a bulk section of the semiconductor substrate 101 interfaces with the electrically insulating layer 102. For example, let it be assumed that the free charge carriers are electrons. In that case, the doped regions illustrated in FIG. 5 may be of the P-type.

Figure 6:
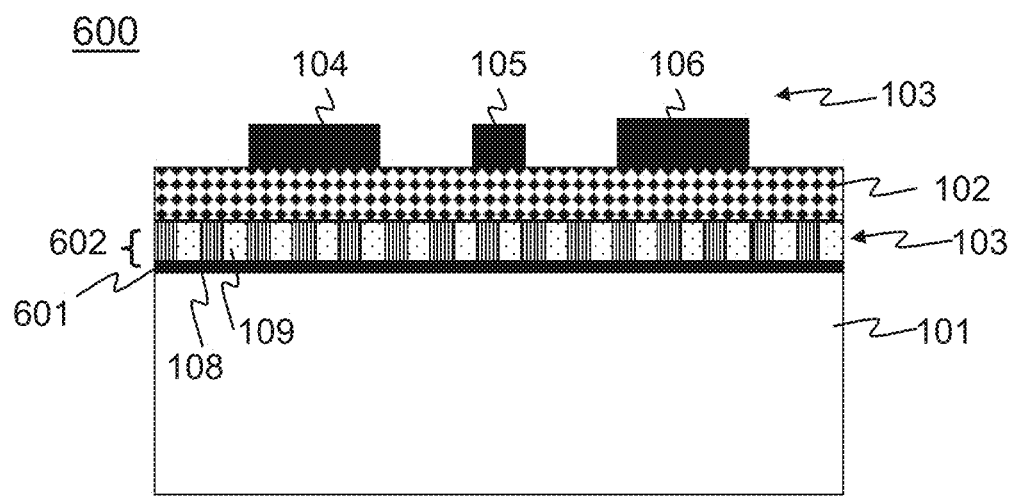
FIG. 6 is a schematic cross-sectional view of a third embodiment of an integrated circuit device comprising a plurality of depletion-inducing junctions.

FIG. 6 schematically illustrates an integrated circuit device 600, which is an alternative to the integrated circuit devices 100, 500 illustrated in FIGS. 1 and 5. FIG. 6 provides a schematic cross-sectional view of integrated circuit device. This embodiment may be obtained on the basis of that illustrated in FIGS. 1 and 2 by adding a relatively thin electrically insulating layer 601 to the integrated circuit device 100. This relatively thin electrically insulating layer 601 interfaces with a bulk section of the semiconductor substrate 101. The relatively thin electrically insulating layer 601 may be less than 100 nm thick. In this embodiment, the plurality of pairs of doped regions 103, which constitutes the plurality of depletion-inducing junctions, is at least partially comprised in a semiconductor layer 602 that contacts the relatively thin electrically insulating layer 601 at a side opposite to that at which the relatively thin electrically insulating layer 601 contacts the semiconductor substrate layer 101.

Figure 7:
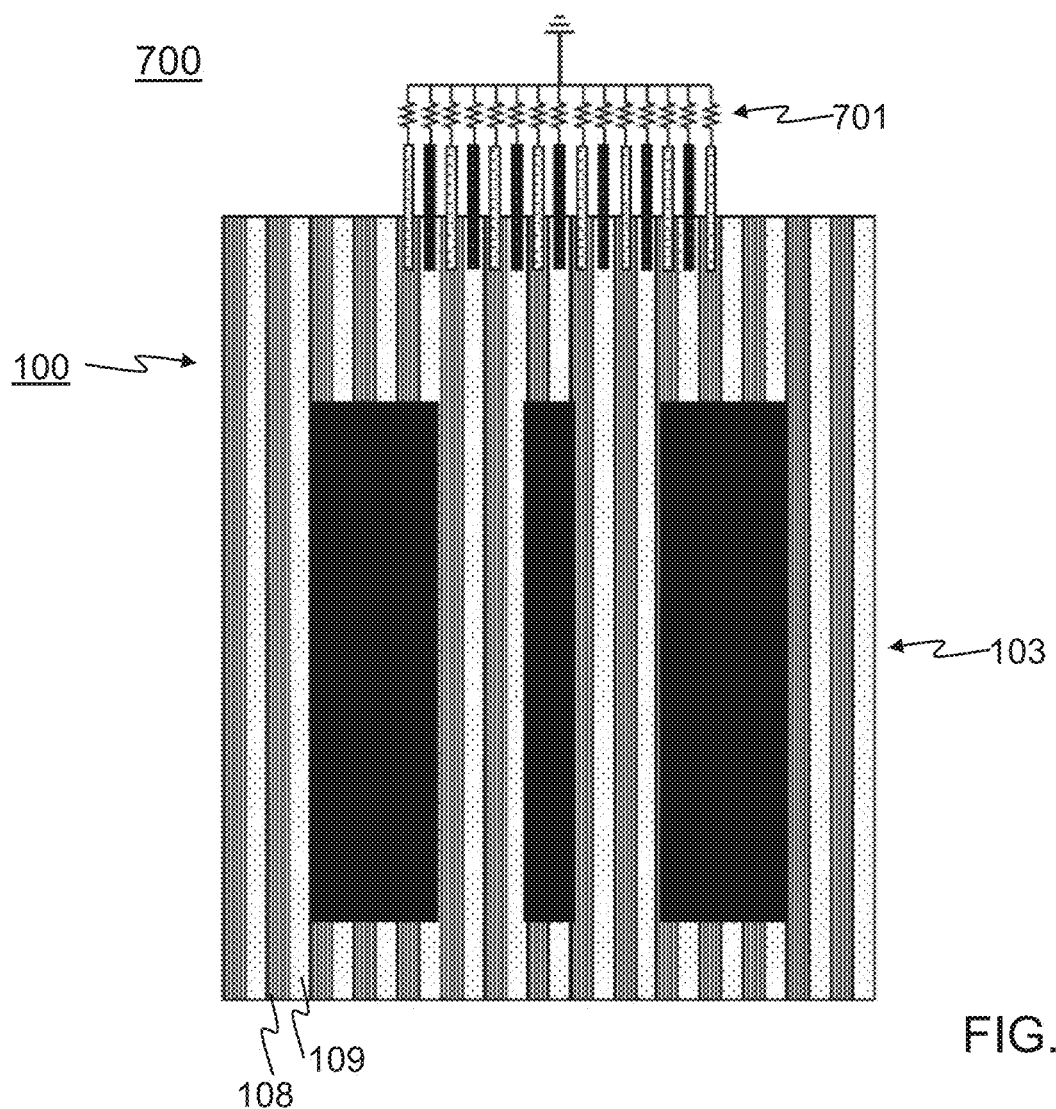
FIG. 7 is a schematic semi-transparent top view of a fourth embodiment of an integrated circuit device comprising a plurality of depletion-inducing junctions.
Figure 8:
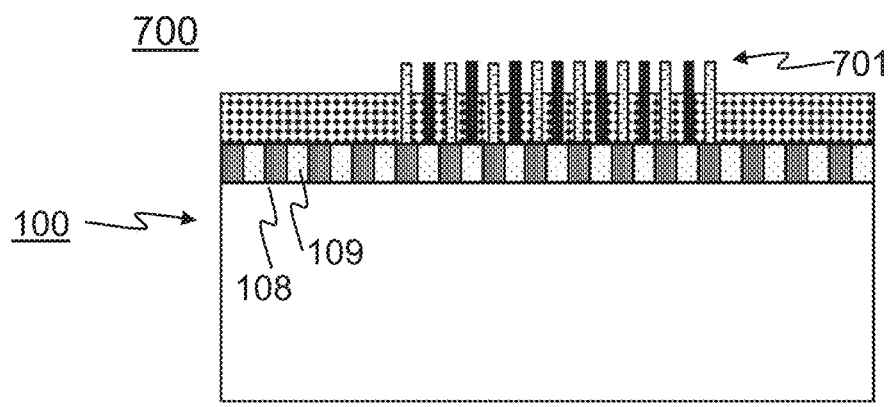
FIG. 8 is a schematic cross-sectional view of the fourth embodiment of the integrated circuit device comprising the plurality of depletion-inducing junctions.

FIGS. 7 and 8 schematically illustrate an integrated circuit device 700, which is an alternative to the integrated circuit devices 100, 500, 600 illustrated in FIGS. 1, 5 and 6. FIG. 7 provides a schematic semi-transparent top view of the integrated circuit device 700. FIG. 8 provides a schematic cross-sectional view of the integrated circuit device 700. This embodiment may be obtained on the basis of that illustrated in FIGS. 1 and 2 by adding a set of electrical contacts 701 through which a biasing voltage can be applied to the plurality of pairs of doped regions 108, 109, which constitutes the plurality of depletion-inducing junctions. The plurality of pairs of doped regions 108, 109 can induce depleted zones as a function of the biasing voltage. This may improve electrical linearity of the upper layer of the semiconductor substrate 101 and may thus prevent distortion of signals in the electrical circuit 103.

Figure 9:
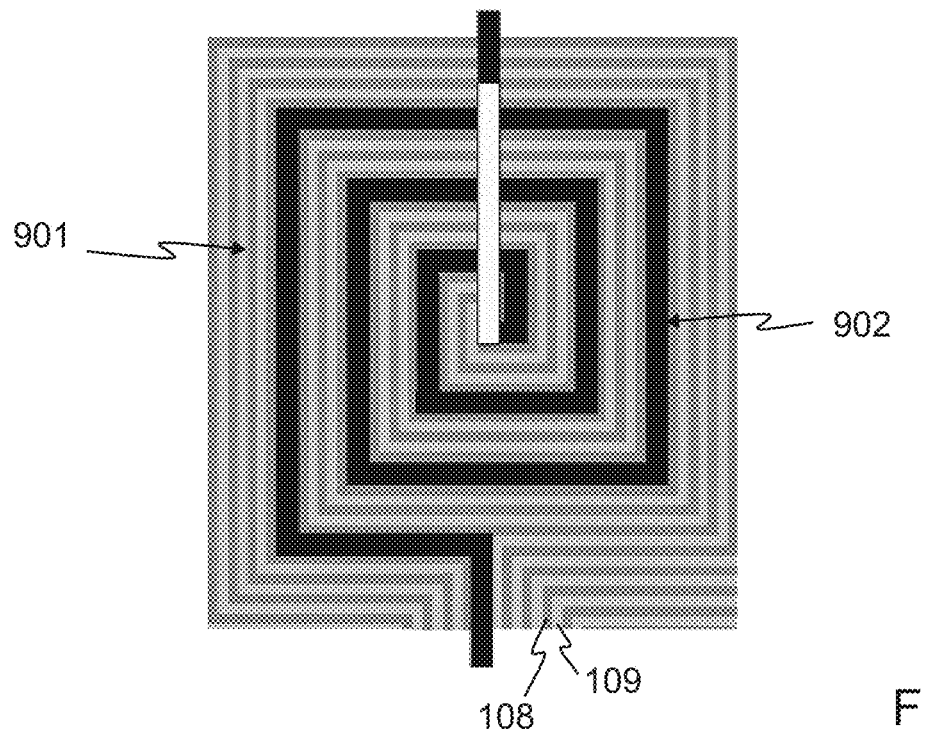
FIG. 9 is a schematic semi-transparent top view of an array-like plurality of depletion-inducing junctions applied to an inductor in an integrated circuit device.

FIG. 9 schematically illustrates an array-like plurality of depletion-inducing junctions 901 applied to an inductor 901 in an integrated circuit device. FIG. 9 provides a schematic semi-transparent top view of the array-like plurality of depletion-inducing junctions 901 applied to the inductor 902. The depletion-inducing junctions 901 are disposed a loop-like manner surrounding sections of the inductor 901 capable of inducing an electrical field in a semiconductor substrate on which the inductor 901 is formed.

Figure 10:
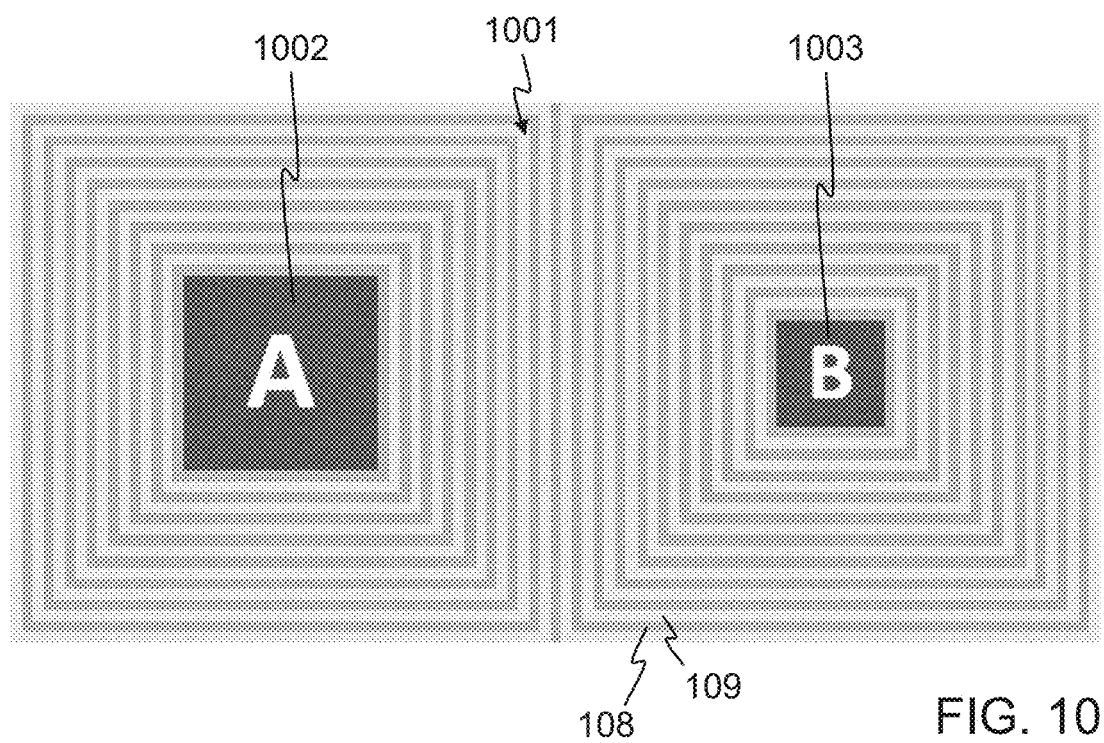
FIG. 10 is a schematic semi-transparent top view of an array-like plurality of depletion-inducing junctions applied to two electrical circuits in an integrated circuit device.

FIG. 10 schematically illustrates an array-like plurality of depletion-inducing junctions 1001 applied to two electrical circuit sections 1002, 1003. FIG. 10 provides a schematic semi-transparent top view of the array-like plurality of depletion-inducing junctions 1001 applied to the two electrical circuit sections 1002, 1003. The plurality of depletion-inducing junctions 1001 is disposed a loop-like manner surrounding the sections 1002, 1003 of the electrical circuit capable of inducing an electrical field in a semiconductor substrate on which the electrical circuit sections 1002, 1003 are formed.

Figure 11:
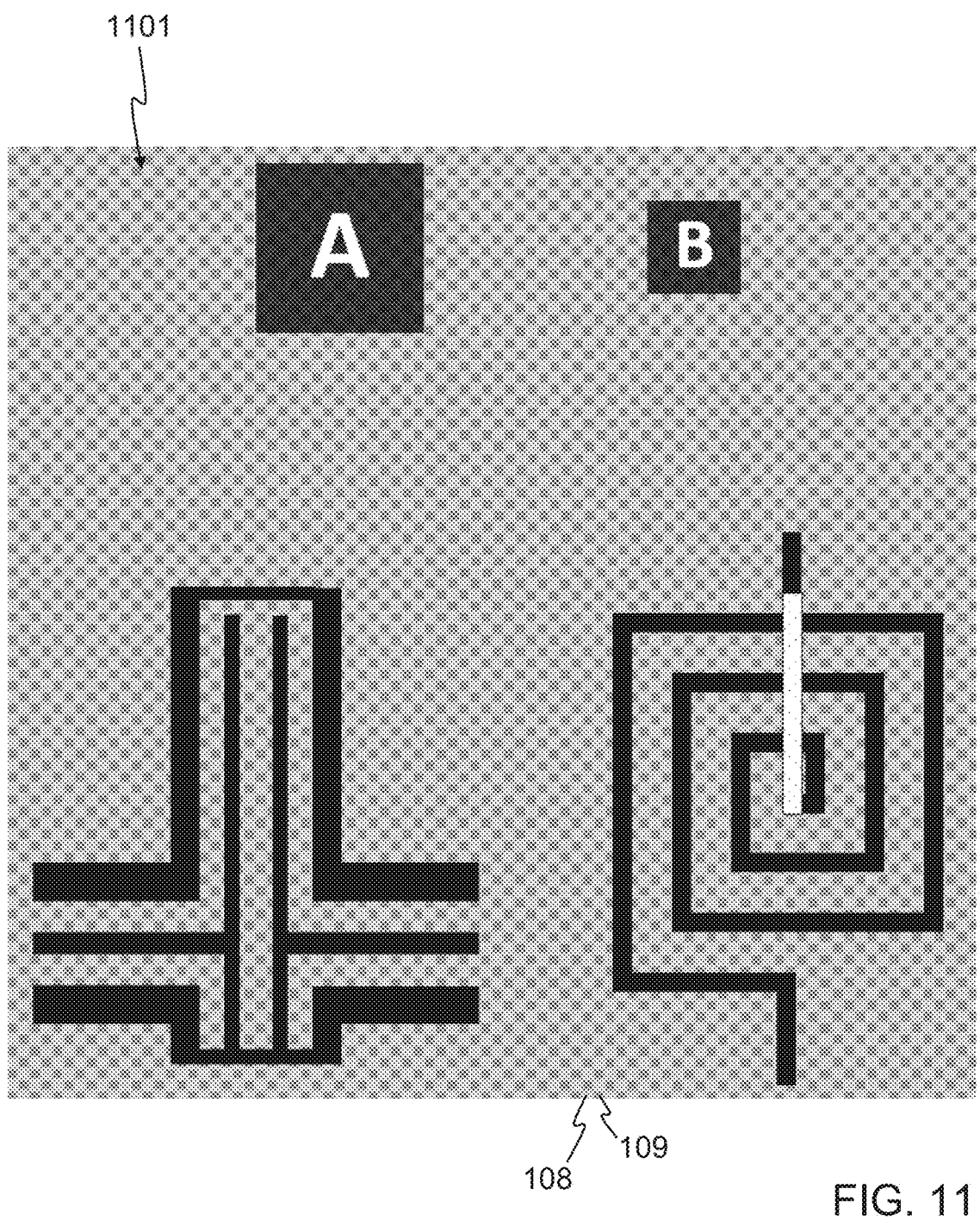
FIG. 11 is a schematic semi-transparent top view of a checkerboard-like plurality of depletion-inducing junctions applied to various electrical circuits in an integrated circuit device.

FIG. 11 schematically illustrates a checkerboard-like plurality of depletion-inducing junctions 1101 applied to various electrical circuits in an integrated circuit device. FIG. 11 provides a schematic semi-transparent top view of the checkerboard-like plurality of depletion-inducing junctions 1101 applied to the various electrical circuits.

Figure 12:
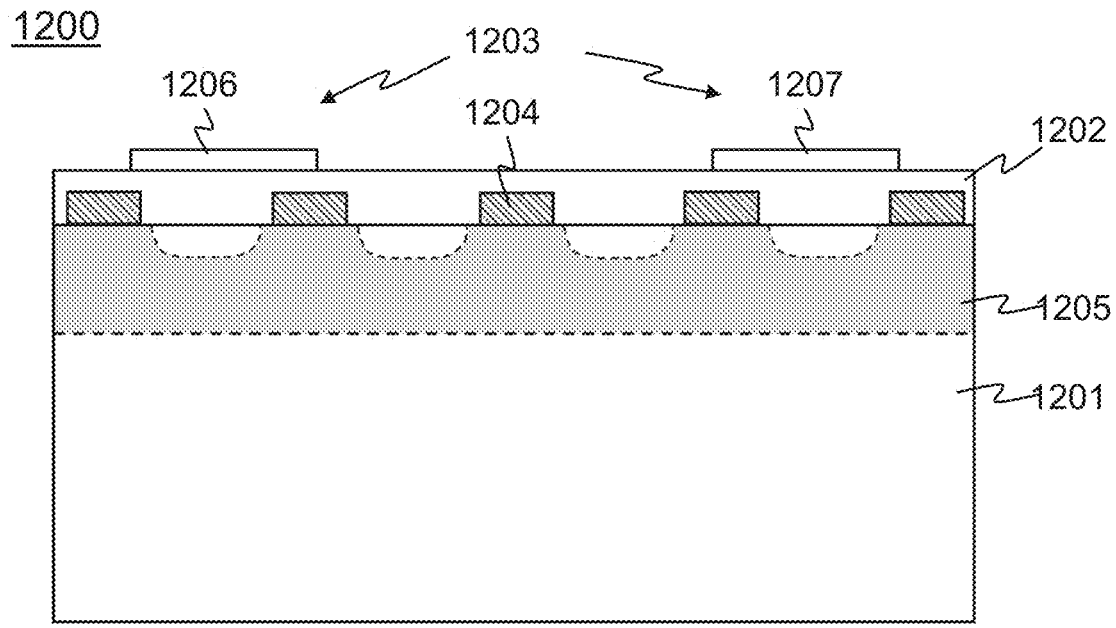
FIG. 12 is a schematic cross-sectional view of a fifth embodiment of an integrated circuit device comprising a plurality of depletion-inducing junctions.

FIG. 12 schematically illustrates an integrated circuit device 1200, which is an alternative to the integrated circuit devices 100, 500; 600, 700 illustrated in FIGS. 1, 5, 6, 7, and 8. FIG. 12 provides a schematic cross-sectional view of integrated circuit device 1200.

The integrated circuit device 1200 comprises a semiconductor substrate 1201, an electrically insulating layer 1202 that contacts the semiconductor substrate 1201, and an electrical circuit 1203 located on the electrically insulating layer 1202. An electrical conductor 1204 traverses the electrically insulating layer 1202 and interfaces with the semiconductor substrate 1201. This forms a Schottky contact, which can make a depleted zone 1205 to extend to this contact. This counters parasitic surface conduction between two sections 1206, 1207 of the electrical circuit 1203.

Figure 13:
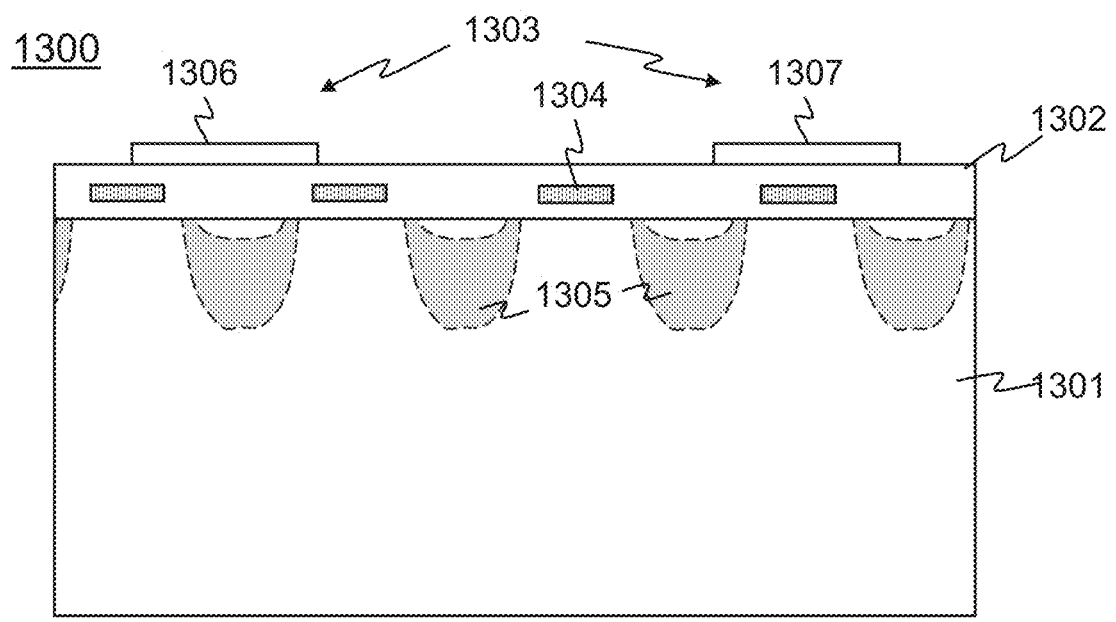
FIG. 13 is a schematic cross-sectional view of an integrated circuit device arranged to create a depleted zone by means of an electrical conductor receiving a biasing voltage.

FIG. 13 schematically illustrates an integrated circuit device arranged to create a depleted zone by means of an electrical conductor receiving a biasing voltage, rather than by means of a depletion-inducing junction as described hereinbefore. FIG. 13 provides a schematic cross-sectional view of integrated circuit device 1300. The integrated circuit device 1300 comprises a semiconductor substrate 1301, an electrically insulating layer 1302 that contacts the semiconductor substrate 1301, and an electrical circuit 1303 located on the electrically insulating layer 1302.

An electrical conductor 1304 is located on or in the electrically insulating layer 1302, The electrical conductor 1304 receives a biasing voltage that induces free charge carriers in a region that extends from the electrically insulating layer 1302 into the semiconductor substrate 1301, The free charge carriers thus induced have a polarity opposite to that of free charge carriers in an adjacent region where a bulk section of the semiconductor substrate 1301 interfaces with the electrically insulating layer 1302. This creates a depleted zone 1305 that counters parasitic surface conduction between two sections 1306, 1307 of the electrical circuit 1303.

A semiconductor wafer may be adapted for manufacturing an integrated circuit device according to any of the embodiments described him before. The semiconductor wafer may comprise a semiconductor substrate, an electrically insulating layer that contacts the semiconductor substrate; and a semiconductor layer located on the electrically insulating layer in which the electrical circuit can be formed, The semiconductor substrate comprises a depletion-inducing junction adapted to induce adapted to autonomously induce in the semiconductor substrate a depleted zone that interfaces with a section of the electrically insulating layer.

In a method of manufacturing an integrated circuit device according to certain embodiments that has been described, a depletion-inducing junction may be formed using a processing step that is also used to form the electrical circuit.

In another method of manufacturing an integrated circuit device according certain embodiments that have been described, a depletion-inducing junction is at least partially formed using at least one of the following techniques: deep implantation and diffusion.

The embodiments described hereinbefore with reference to the drawings are presented by way of illustration. The invention may be implemented in numerous different ways. In order to illustrate this, some alternatives are briefly indicated.

The invention may be applied in numerous types of products or methods that involve integrated circuits on semiconductor substrates.

The term "electrical circuit" should be understood in a broad sense. This term may embrace any entity having a function that involves an electrical quantity, such as, for example, a micro electro-mechanical system (MEMS), a transmission line, an electrical connection.

In general, there are numerous different ways of implementing the invention, whereby different implementations may have different topologies. In any given topology, a single entity may carry out several functions, or several entities may jointly carry out a single function. In this respect, the drawings are very diagrammatic.

The remarks made hereinbefore demonstrate that the embodiments described with reference to the drawings illustrate the invention, rather than limit the invention. The invention can be implemented in numerous alternative ways that are within the scope of the appended claims. All changes that come within the meaning and range of equivalency of the claims are to be embraced within their scope. Any reference sign in a claim should not be construed as limiting the claim. The verb "comprise" in a claim does not exclude the presence of other elements or other steps than those listed in the claim. The same applies to similar verbs such as "include" and "contain". The mention of an element in singular in a claim pertaining to a product, does not exclude that the product may comprise a plurality of such elements. Likewise, the mention of a step in singular in a claim pertaining to a method does not exclude that the method may comprise a plurality of such steps. The mere fact that respective dependent claims define respective additional features, does not exclude combinations of additional features other than those reflected in the claims.

The invention claimed is:

1. An integrated circuit device comprising:
a semiconductor substrate having a resistivity of at least 100 Ω·cm;
an electrically insulating layer that contacts the semiconductor substrate, the electrically insulating layer being susceptible of inducing in the semiconductor substrate a parasitic surface conduction layer that interfaces with the electrically insulating layer; and
an electrical circuit located on the electrically insulating layer,
wherein the integrated circuit device comprises a plurality of depletion-inducing junctions at least partially comprised in the semiconductor substrate, the plurality of depletion-inducing junctions being adapted to autonomously induce in the semiconductor substrate a plurality of depleted zones that interface with the electrically insulating layer, whereby the depletion-inducing junctions are disposed in one of the following manners: an array-like manner and a checkerboard-like manner, and whereby at least some depletion-inducing junctions of the plurality interface with a section of the electrically insulating layer that lies in-between two sections of the electrical circuit.

2. An integrated circuit device according to claim 1, wherein a depletion-inducing junction comprises a doped region in the semiconductor substrate near the electrically insulating layer the doped region having polarity that is opposite to a polarity of free charge carriers in an adjacent region where a bulk section of the semiconductor substrate interfaces with the electrically insulating layer.

3. An integrated circuit device according to claim 2, wherein the depletion-inducing junction comprises another doped region in the semiconductor substrate near the electrically insulating layer, the one and the other doped region interfacing with each other and having opposite polarities.

4. An integrated circuit device according to claim 1, wherein a depletion-inducing junction comprises an electrical conductor that traverses the electrically insulating layer and that interfaces with the semiconductor substrate thereby forming a Schottky contact.

5. An integrated circuit device according to claim 1, comprising a set of electrical contacts through which a biasing voltage can be applied to at least some depletion-inducing junctions of the plurality.

6. An integrated circuit device claim 1, wherein at least some depletion-inducing junctions of the plurality that are disposed in an array-like manner are further disposed in a loop-like manner surrounding at least one of the two sections of the electrical circuit.

7. A semiconductor wafer adapted for manufacturing an integrated circuit device according to claim 1, the semiconductor wafer comprising:
a semiconductor substrate having a resistivity of at least 100 Ω·cm;
an electrically insulating layer that contacts the semiconductor substrate, the electrically insulating layer being susceptible of inducing in the semiconductor substrate a parasitic surface conduction layer that interfaces with the electrically insulating layer; and
a semiconductor layer located on the electrically insulating layer in which the electrical circuit can be formed,
wherein the semiconductor wafer comprises a plurality of depletion-inducing junctions at least partially comprised in the semiconductor substrate, the plurality of depletion-inducing junctions being adapted to autonomously induce in the semiconductor substrate a plurality of depleted zones that interface with the electrically insulating layer, whereby the depletion-inducing junctions are disposed in one of the following manners: an array-like manner and a checkerboard-like manner.

8. A method of manufacturing an integrated circuit device according to any of claim 1, comprising the step of forming a plurality of depletion-inducing junctions at least partially in a semiconductor substrate having a resistivity of at least 100 Ω·cm, the depletion-inducing junctions being formed to autonomously induce in the semiconductor substrate a plurality of depleted zones that interface with a section of an electrically insulating layer susceptible of inducing in the semiconductor substrate a parasitic surface conduction layer that interfaces with the electrically insulating layer, whereby the depletion-inducing junctions are formed so that these are disposed in one of the following manners: an array-like manner and a checkerboard-like manner.

9. A method of manufacturing according to claim 8, wherein the depletion-inducing junctions are formed using a processing step that is also used to form the electrical circuit.

10. A method of manufacturing according to claim 8, wherein the depletion-inducing junctions are at least partially formed using at least one of the following techniques: implantation and diffusion.

* * * * *